United States Patent
Gero et al.

(10) Patent No.: US 8,328,945 B2
(45) Date of Patent: Dec. 11, 2012

(54) COATING APPARATUS AND METHOD WITH INDIRECT THERMAL STABILIZATION

(75) Inventors: Peter F. Gero, Portland, CT (US); Kevin W. Schlichting, South Glastonbury, CT (US); James W. Neal, Ellington, CT (US)

(73) Assignee: United Technologies Corporation, Hartford, CT (US)

( * ) Notice: Subject to any disclaimer, the term of this patent is extended or adjusted under 35 U.S.C. 154(b) by 276 days.

(21) Appl. No.: 12/723,436

(22) Filed: Mar. 12, 2010

(65) Prior Publication Data

US 2011/0223356 A1   Sep. 15, 2011

(51) Int. Cl.
*C23C 16/00*  (2006.01)
*H05H 1/20*  (2006.01)

(52) U.S. Cl. ......... 118/726; 118/715; 118/719; 427/573

(58) Field of Classification Search ................. 118/715, 118/719, 726; 219/121.15, 121.36, 121.47, 219/121.48; 427/446–456, 481, 496, 497, 427/573
See application file for complete search history.

(56) References Cited

U.S. PATENT DOCUMENTS

| | | | |
|---|---|---|---|
| 3,560,252 A | 2/1971 | Kennedy | |
| 4,224,897 A * | 9/1980 | Dugdale | 118/719 |
| 4,481,237 A | 11/1984 | Bosshart et al. | |
| 4,795,656 A * | 1/1989 | Mizoguchi et al. | 427/527 |
| 4,876,114 A * | 10/1989 | Phinney et al. | 427/561 |
| 5,047,612 A * | 9/1991 | Savkar et al. | 219/121.47 |
| 5,760,366 A * | 6/1998 | Haruta et al. | 219/121.68 |
| 5,792,521 A | 8/1998 | Wortman | |
| 5,942,334 A | 8/1999 | Wortman | |
| 5,986,233 A * | 11/1999 | Antieau et al. | 219/121.13 |
| 5,998,003 A | 12/1999 | Courtright et al. | |
| 6,054,184 A | 4/2000 | Bruce et al. | |
| 6,083,322 A | 7/2000 | Burns et al. | |
| 6,197,118 B1 * | 3/2001 | Sakai | 118/715 |
| 6,210,744 B1 | 4/2001 | Hayess et al. | |
| 6,217,662 B1 | 4/2001 | Kong et al. | |
| 6,245,152 B1 * | 6/2001 | Imai et al. | 118/728 |
| 6,365,013 B1 | 4/2002 | Beele | |
| 6,365,236 B1 | 4/2002 | Maloney | |
| 6,635,124 B1 | 10/2003 | Stowell et al. | |
| 6,677,560 B2 | 1/2004 | Eberhardt et al. | |
| 6,689,995 B2 | 2/2004 | Eberhardt et al. | |
| 6,946,034 B1 | 9/2005 | Bruce et al. | |
| 7,128,950 B2 | 10/2006 | Bruce et al. | |

(Continued)

FOREIGN PATENT DOCUMENTS

DE   4135326 C1   6/1993

(Continued)

OTHER PUBLICATIONS

The extended European Search Report of counterpart European Application No. 11250293 filed Mar. 12, 2010.

(Continued)

*Primary Examiner* — Rakesh Dhingra
(74) *Attorney, Agent, or Firm* — Kinney & Lange, P.A.

(57) ABSTRACT

An apparatus includes a work piece support for holding and selectively rotating a work piece, a coating delivery apparatus configured to apply a coating material to the work piece, a susceptor positioned adjacent to the work piece support, and a first electron gun configured to direct a first electron beam at the susceptor such that the susceptor radiates heat toward the work piece.

20 Claims, 2 Drawing Sheets

U.S. PATENT DOCUMENTS

| | | | |
|---|---|---|---|
| 7,276,125 B2 * | 10/2007 | Miyamoto et al. | 118/725 |
| 7,482,035 B2 | 1/2009 | Schmid et al. | |
| 2003/0047139 A1 * | 3/2003 | Corderman et al. | 118/723 EB |
| 2003/0051667 A1 * | 3/2003 | Tamagaki | 118/726 |
| 2003/0203127 A1 | 10/2003 | Bruce et al. | |
| 2004/0058155 A1 | 3/2004 | Windischmann | |
| 2004/0089232 A1 * | 5/2004 | Sasaki et al. | 118/620 |
| 2007/0194001 A1 * | 8/2007 | Shibagaki et al. | 219/390 |
| 2007/0259173 A1 | 11/2007 | Refke et al. | |
| 2008/0166489 A1 | 7/2008 | Strock et al. | |
| 2008/0226837 A1 | 9/2008 | Damani et al. | |
| 2008/0241385 A1 * | 10/2008 | Oshima et al. | 427/255.39 |

FOREIGN PATENT DOCUMENTS

| | | |
|---|---|---|
| EP | 2157204 A1 | 2/2010 |
| GB | 2323855 A | 10/1998 |

OTHER PUBLICATIONS

Induction Atmospheres "Heating an Inconnel Susceptor for Jet Fan Blades in Argon," Applications Research Database (1 page) Retrieved Nov. 30, 2009.

Karnitz et al., "ATS Materials/Manufacturing," U.S. Department of Energy-Oak Ridge, Oak Ridge, TN, 1997 (29 pages).

Krumdieck et al., "Conversion Efficiency of Alkoxide Precursor to Oxide Films Grown by an Ultrasonic-Assisted, Pulsed Liquid Injection, Metalorganic Chemical Vapor Deposition (Pulsed-CVD) Process," J. Am. Ceram. Soc., 82 (6) 1605-07, 1999.

Tzimas, "Failure of thermal barrier coating systems under cyclic thermomemchanical loading, "Acta Materialia, vol. 48, Issue 18, 2009 (abstract only).

* cited by examiner

COATING APPARATUS AND METHOD WITH INDIRECT THERMAL STABILIZATION

BACKGROUND

The present invention relates to coating apparatuses and methods of applying coatings.

Coatings are utilized in a variety of settings to provide a variety of benefits. For example, modern gas turbine engines can include thermal barrier coatings (TBCs), environmental coatings, etc. to help promote efficient and reliable operation. Application of coatings can involve a variety of different application methods, such as plasma-based physical vapor deposition (PVD). When TBCs are applied to gas turbine engine components, such as blades and vanes, using plasma-based-PVD, the components being coated are rotated within a process chamber while a plasma stream directs the coating material at the components. Examples of such known coating processes are disclosed in U.S. Pat. No. 7,482,035 and in U.S. Pat. App. Pub. Nos. 2007/0259173A1 and 2008/0226837A1.

A significant problem with known plasma-based PVD processes is the loss of work-piece temperature to down-stream portions of the plasma-based PVD equipment. A plasma gun generating the plasma stream is the only source of heat in the system. The walls of the process chamber are typically cooled to approximately 15-20° C., and thereby remove heat from the process chamber, and a downstream end of the process chamber includes equipment to collect and cool excess coating material, thereby also removing thermal energy from the process chamber. Components being coated tend to be cyclically heated and cooled as they rotate because portions of the components that face downstream and away from the plasma stream cool to lower temperatures. TBCs are sensitive to thermal conditions during the coating application process, and undesirable thermal conditions can cause detrimental changes to the microstructure of the TBC. In particular, the TBC develops striations and a cauliflower-like structure due to poor temperature control. While in a typical application it is desired to maintain the components being coated at a temperature of approximately 1038° C. (1900° F.), temperatures can range from approximately 871-1093° C. (1600-2000° F.). Moreover, as portions of the components being coated are rotated back to face the plasma stream, separation between new, hot layers of the coating and the cooler interface of previously-applied coating material can make the resultant coating undesirably friable and prone to separation between layers of the coating. These microstructural characteristics are known to cause a debit in service life for the turbine engine component.

One approach known in the art for providing temperature control involves passive thermal shielding. However, passive thermal shielding mitigates only off-axis heat loss to a relatively cold process chamber. The core reason for this effect is the flow-through nature of the coating vapor stream created via the plasma stream. Laterally-oriented passive spray shielding is incapable of ensuring heat-loss from downstream areas of the process chamber where the plasma plume and waste ceramic vapor are cooled and collected for extraction from the process chamber.

Thus, it is desired to provide a coating apparatus and method with improved thermal stabilization.

SUMMARY

An apparatus according to the present invention includes a work piece support for holding and selectively rotating a work piece, a coating delivery apparatus configured to apply a coating material to the work piece, a susceptor positioned adjacent to the work piece support, and a first electron gun configured to direct a first electron beam at the susceptor such that the susceptor radiates heat toward the work piece.

DETAILED DESCRIPTION

In general, the present invention provides an apparatus and method for coating work pieces while providing indirect thermal stabilization. One or more electron beams are directed at a susceptor that in turn radiates heat towards at least one work piece to help promote thermal stability during coating. The susceptor can be positioned downstream of the work piece, relative to a source of coating material, and can be shaped to include a central opening to allow excess coating material to pass through. The susceptor can be made from an oxide-ceramic material, or other suitable materials, and can have either a one-piece or multi-piece (e.g., segmented) construction. The present invention is suitable for applying thermal barrier coatings (TBCs) to gas turbine engine components, in addition to other uses.

Figure 1:
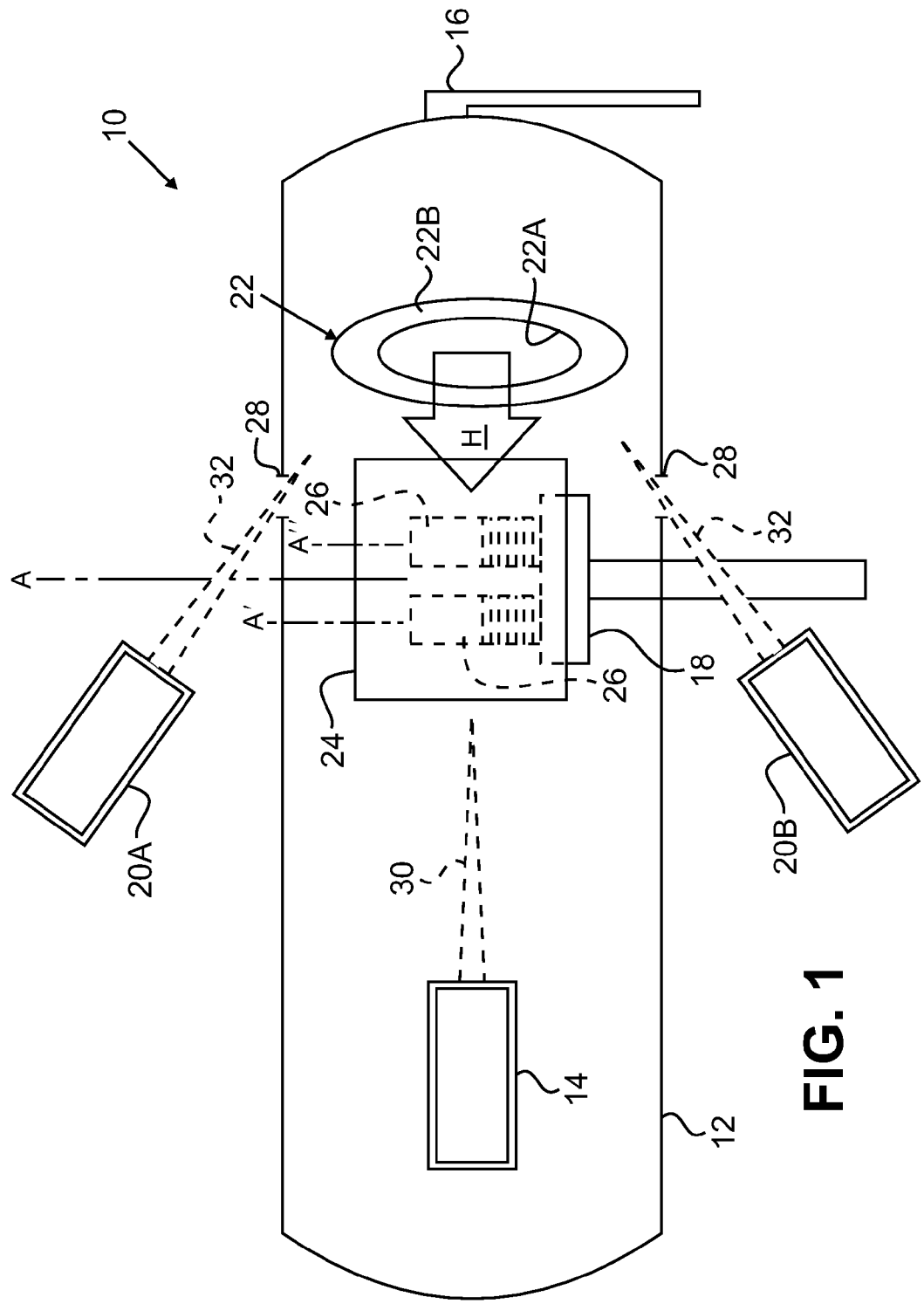
FIG. 1 is a schematic illustration of a coating apparatus according to the present invention.

FIG. 1 is a schematic illustration of one embodiment of a coating apparatus 10 that includes a process chamber 12, a plasma gun 14, a pumping assembly 16, a work piece support fixture 18, electron guns 20A and 20B, a susceptor 22 and a thermal hood 24. One or more work pieces 26 desired to be coated can be secured to the work piece support fixture 18. In the illustrated embodiment, the work pieces 26 are turbine blades for a gas turbine engine, though it will be understood that the work pieces 26 can be nearly any type of component in further embodiments.

The process chamber 12 provides a contained environment for application of the coating material to the work pieces 26. In the illustrated embodiment, the process chamber 12 includes fluid-cooled walls, which can be cooled with water at approximately 15-20° C. (60-70° F.). Suitable passive thermal insulation (not shown) can be provided adjacent to the walls of the process chamber 12 in a known manner. The process chamber 12 defines an interior space that is held in a vacuum (i.e., a partial vacuum), with the vacuum in the range of approximately 66.66 Pa (0.5 Torr) to approximately 1.33 kPa (10 Torr). Aerodynamic windows 28 can be valve-like structures formed through the walls of the process chamber 12 that provide physical passageways through the walls of the process chamber 12 while still helping to maintain a desired pressure differential (e.g., maintaining the vacuum inside the process chamber 12).

The plasma gun 14 is typically positioned within the process chamber 12. The plasma gun 14 can be of a known type that produces a plasma jet into which a coating material, such as a ceramic TBC powder, is introduced to produce a stream 30 that includes the coating material in a vapor phase. The stream 30 is directed toward the work pieces 26 and the work piece support fixture 18 to provide plasma-based physical vapor deposition (PVD) coating application. During operation, the plasma gun 14 generates an immense amount of thermal energy within the process chamber 12, with temperatures typically ranging from approximately 871-1093° C. (1600-2000° F.) near the work pieces 26. For a typical ceramic TBC, it is desirable to coat the work pieces 26 at a temperature of approximately 1038° C. (1900° F.). The plasma gun 14 is the primary source of thermal energy used to heat the work pieces 26 to the desired temperature. It will be appreciated by those of ordinary skill in the art that the particular composition of the coating material can vary as desired for particular applications. For instance, the coating material can be nearly any type of TBC, bond coating, environmental coating, etc. Optimal coating process temperatures can vary for different coating materials. Moreover, in alternative embodiments a different type of coating supply and delivery apparatus can be substituted for the plasma gun 14, as desired for particular applications.

Excess coating material, that is, coating material not deposited on the work pieces 26, can be cooled and collected by the pumping assembly 16. In the illustrated embodiment, the pumping assembly is of a conventional configuration that allows for extraction and collection of excess coating material from the process chamber 12, as well as cooling of that excess coating material. The pumping assembly 16 is typically located at an end of the process chamber opposite the plasma gun 14. Because the pumping assembly 16 cools and removes the excess coating material, an end of the process chamber 12 where the pumping assembly 16 is located tends to exhibit cooler temperatures than in areas near the plasma gun 14.

In the illustrated embodiment, the work pieces 26 desired to be coated are secured to the work piece support fixture 18 in the path of the stream 30, downstream from the plasma gun 14. The work piece support fixture 18 can selectively index the work pieces 26 relative to the stream 30 and the plasma gun 14, in order to expose different portions of the work pieces 26 to the stream 30 in a uniform manner so that the coating material can cover all sides of the work pieces 26 substantially equally. In one embodiment, the work piece support fixture 18 is configured to rotate the work pieces 26 in a planetary fashion, with all of the work pieces 26 commonly rotating about a central axis A and each of the work pieces 26 individually rotating about a dedicated axis A' or A".

Because portions of the work pieces 26 are rotated away from the plasma gun 14 and the stream 30 at times, those portions are generally not heated by the plasma gun 14 and the stream 30 as much as those portions facing the plasma gun 14 and the stream 30. Coatings like TBCs are sensitive to thermal conditions during the coating application process, and undesirable thermal conditions can cause detrimental microstructural properties of the TBCs formed on the work pieces 26. In particular, TBCs can develop striations and a cauliflower-like structure if temperature control at or near the work pieces 26 is poor. Moreover, cyclic temperature variations common to prior art coating processes can cause separation between new, hot "layers" of the coating material from the stream 30 and cooler interfaces of previously-applied coating material already deposited on the work pieces 26, making resultant coatings undesirably friable and prone to separation. Temperature variations of 38° C. (100° F.) or more in process chambers are common with prior art plasma coating processes, and such large temperature variations tend to produce undesirable coating microstructures. As explained further below, the susceptor 22 and the thermal hood 24 can help reduce such temperature variations and help improve the resultant coating microstructure.

The electron guns 20A and 20B can be positioned outside the process chamber 12, and can generate electron beams 32 directed into the process chamber 12 through the aerodynamic windows 28. The electron guns 20A and 20B can be differentially-pumped. Furthermore, locating the electron guns 20A and 20B outside of the process chamber 12 allows those guns 20A and 20B to be maintained at a different—and typically lower—operating pressure than the vacuum maintained inside the process chamber 12. Each of the electron guns 20A and 20B can have magnetic coils or other mechanisms used to control and direct the electron beams 32 in a desired manner, such as to allow scanning of the electron beams 32 in a rasterized fashion. Although two electron guns 20A and 20B are shown in the illustrated embodiment, any number of electron guns can be utilized in further embodiments, and only a single electron gun can be used in some embodiments.

The susceptor 22 is positioned within the process chamber 12 generally adjacent to the work piece support fixture 18 at a location downstream from the work pieces 26. In other words, the work pieces 26 and the work piece support fixture 18 can be positioned in between the plasma gun 14 and the susceptor 22, with the susceptor 22 at an opposite side of the work pieces 26 from the plasma gun 14 (i.e., at a downstream side of the work pieces 26 that faces away from the oncoming stream 30) and with the susceptor 22 positioned in between the work pieces 26 and the pumping assembly 16. Any suitable means can be used to secure the susceptor 22 within the process chamber 12. The susceptor 22 defines a central opening 22A and an upstream face 22B. Excess coating material from the stream 30 can pass through the opening 22A, thereby allowing that excess coating material to be collected downstream by the pumping assembly 16. The susceptor 22 can have a one-piece (i.e., unitary) construction or can have a multi-piece configuration (e.g., as an assembly made up of a plurality of discrete segments). In the embodiment illustrated in FIG. 1, the susceptor 22 has a substantially annular shape. In alternative embodiments the susceptor 22 can have other shapes. The susceptor 22 can be made of an oxide-based ceramic material. The effectiveness of oxide-based ceramic susceptors is generally not degraded by deposition of ceramic coating material, thereby enhancing compatibility of the susceptor 22 with a ceramic deposition process such as with ceramic-based TBC deposition. Other materials, such as metallic materials, can also be used to make the susceptor 22 in further embodiments.

During operation, the electron guns 20A and 20B direct the electron beams 32 at the upstream face 22B of the susceptor 22. The electron guns 20A and 20B can scan the electron beams 32 across at least portions of the upstream face 22B of the susceptor 22, thereby allowing the electron beams 32 to remain relatively focused while still directing energy to a relatively large area of the upstream face 22B. The electron beams 32 cause the susceptor 22 to radiate heat, designated by an arrow H in FIG. 1. The susceptor 22 can be positioned such that the heat H radiating is directed toward the work piece support fixture 18 to heat the work pieces 26. Furthermore, the susceptor 22 can be positioned such that the heat H is radiated in a generally axial direction relative to the stream 30 to heat portions of the work pieces 26 facing away from the plasma gun 14 and the oncoming stream 30 (i.e., downstream portions of the work pieces 26). The additional heat generated by the susceptor 22 helps to thermally stabilize the work pieces 26, and reduce cyclical heat and cooling effects caused by rotation of the work pieces 26 relative to the plasma gun 14 and the stream 30. In other words, the heat H that is radiated from the susceptor 22 helps reduce or prevent temperature loss as the work pieces 26 rotate and face an aft, downstream portion of the process chamber 12 where the pumping assembly 16 is located.

The electron guns 20A and 20B can be positioned such that the electron beams 32 can reach the susceptor 22 without crossing the stream 30, including related plumes of the coating material present inside the process chamber 12. The coating material in the stream 30 would tend to obstruct the electron beams 32 and thereby decrease the amount of energy delivered to the susceptor 22. By positioning the electron guns 20A and 20B at spaced locations, such as at opposite sides of the process chamber 12, viewing angles of the electron guns 20A and 20B relative to the susceptor 22 can be provided so that the electron beams 32 need not cross or otherwise intersect or partially pass through the stream 30.

The thermal hood 24 is positioned inside the process chamber 12 to partially surround the work piece support fixture 18 and the work pieces 26 to provide thermal shielding to help maintain thermal stabilization of the work pieces 26. In one embodiment, the thermal hood 24 is configured to provide reflective infrared shielding. The thermal hood 24 includes upstream and downstream openings for accepting the stream 30 from the plasma gun 14, and also allowing excess coating material to pass through toward the pumping assembly 16. In some embodiments, the thermal hood 24 can be moveable (using any suitable actuation mechanism) to further help regulate thermal conditions in the process chamber 12. In further embodiments, the thermal hood 24 can be omitted.

Figure 2:
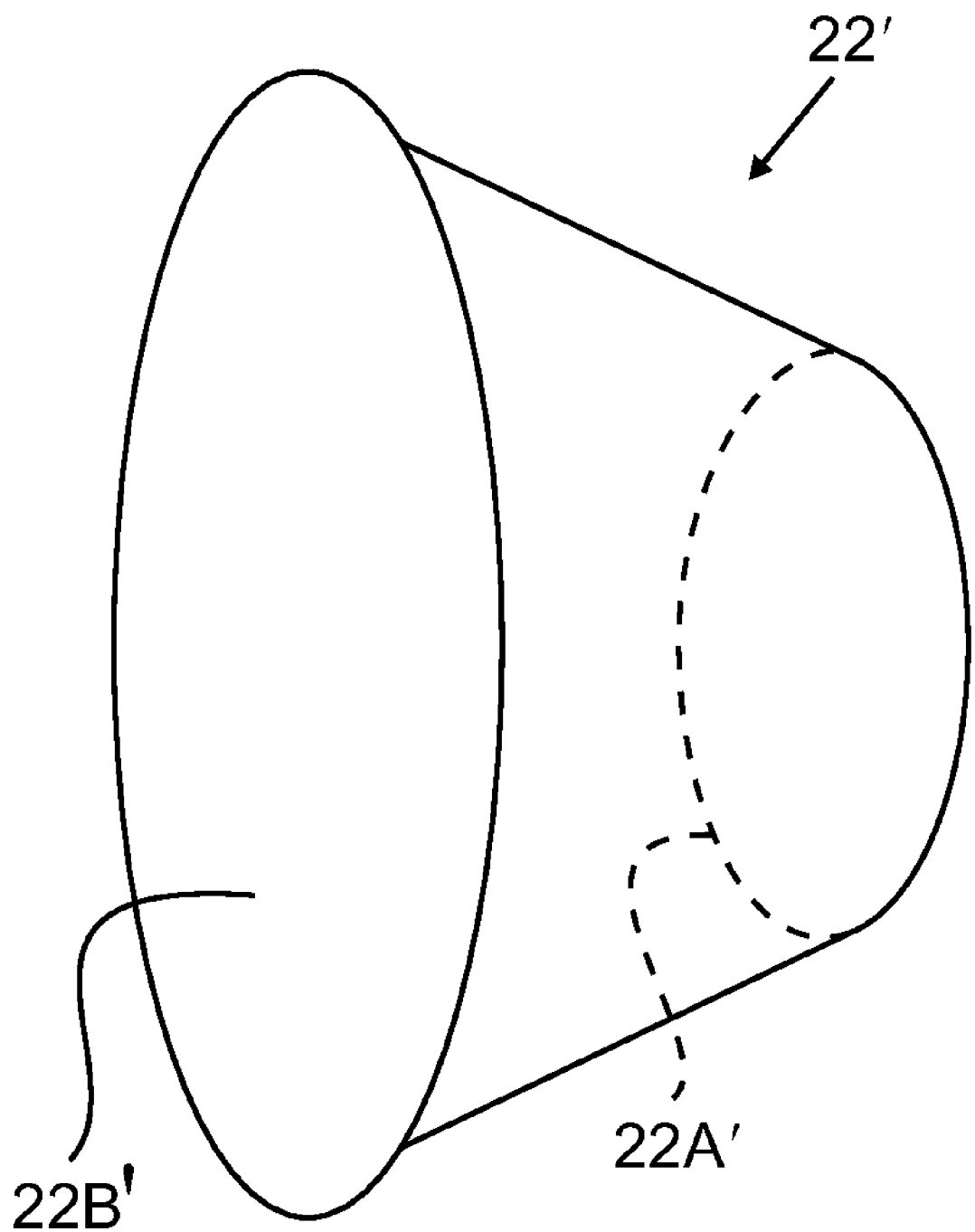
FIG. 2 is a perspective view of an alternative embodiment of a susceptor suitable for use with the coating apparatus of FIG. 1.

FIG. 2 is a perspective view of an alternative embodiment of a susceptor 22' that is suitable for use with the coating apparatus 10. The susceptor 22' includes a central opening 22A' and an upstream face 22B'. Operation and construction of the susceptor 22' is generally similar to that of the susceptor 22 described above. However, in the embodiment shown in FIG. 2, the susceptor 22' has a substantially frusto-conical shape. It is generally beneficial to maintain a perpendicular orientation between the susceptor 22' and each of the work pieces 26, regardless of the particular orientation of the work pieces 26 over time as they are rotated. The frusto-conical shape of the susceptor 22' helps maintain such a perpendicular orientation relative to the work pieces 26, such that the radiated heat from the susceptor 22' is distributed relatively evenly to the work pieces 26.

It will be recognized that the present invention provides numerous advantages and benefits. For example, heat provided by a susceptor according to the present invention helps reduce or prevent microstructure degradation caused by cyclic cooling and heating of an applied coating as the coating is deposited on a work piece. More specifically, an approximately 38° C. (100° F.) or greater surface temperature variation on work pieces can be reduced to approximately 12° C. (10° F.) or less. Thus, the present invention helps to maintain work pieces at a desired and relatively uniform temperature to help ensure that the deposited coating (e.g., TBC) is of dependably aircraft quality and suitable for flight service. For instance, the present invention can help provide desirable columnar TBC microstructures on work pieces.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims. For example, components of the coating apparatus described above can be positioned only partially within the process chamber. Moreover, the particular configuration and arrangement of components of the coating apparatus can vary as desired for particular applications.

The invention claimed is:

1. An apparatus comprising:
    a work piece support for holding and rotating a work piece;
    a coating delivery apparatus configured to apply a coating material to the work piece;
    a susceptor positioned adjacent to the work piece support and spaced downstream from the work piece support, wherein the susceptor has a central opening configured to allow excess coating material to pass through the susceptor; and
    a first electron gun configured to direct a first electron beam at the susceptor such that the susceptor radiates heat toward the work piece in a direction opposite to a stream direction for application of the coating material by the coating delivery apparatus, wherein the work piece support is positioned between the coating delivery apparatus and the susceptor.

2. The apparatus of claim 1, wherein the coating delivery apparatus comprises a plasma gun for plasma-based spray deposition of the coating material on the work piece.

3. The apparatus of claim 1, wherein the susceptor has an annular shape.

4. The apparatus of claim 1, wherein the susceptor has a frusto-conical shape.

5. The apparatus of claim 1, wherein the susceptor is formed as a single piece.

6. The apparatus of claim 1, wherein the susceptor has a segmented configuration.

7. The apparatus of claim 1, wherein the susceptor comprises an oxide-based ceramic material.

8. The apparatus of claim 1 and further comprising:
    a process chamber, wherein the coating delivery apparatus, the work piece support and the susceptor are each positioned at least partially within the process chamber.

9. The apparatus of claim 8, and further comprising:
    a pumping assembly for maintaining an interior of the process chamber in a vacuum during applying of the coating material.

10. The apparatus of claim 9, wherein the vacuum is in a range from approximately 66.66 Pa (0.5 Torr) to approximately 1.33 kPa (10 Torr).

11. The apparatus of claim 9 and further comprising:
    an aerodynamic window defined through a wall of the process chamber, wherein the first electron gun is located outside the process chamber and positioned to direct the first electron beam through the aerodynamic window to the susceptor.

12. The apparatus of claim 8 and further comprising:
    a thermal hood located at least partially inside the process chamber, wherein the thermal hood partially surrounds the work piece support to provide thermal shielding, and wherein the thermal hood includes an opening for accepting a stream of the coating material from the coating apparatus.

13. The apparatus of claim 12, wherein the thermal hood provides reflective infrared shielding.

14. The apparatus of claim 1 and further comprising:
    a second electron gun configured to direct a second electron beam at the susceptor, wherein the second electron gun is arranged at an opposite side of the work piece support from the first electron gun.

15. The apparatus of claim 14, wherein the first electron gun is positioned such that the first electron beam can reach the susceptor without crossing a stream of the coating material from the coating delivery apparatus, and wherein the second electron gun is positioned such that the second electron beam can reach the susceptor without crossing the stream of the coating material from the coating delivery apparatus.

16. The apparatus of claim 1, wherein the first electron gun is positioned such that the first electron beam can reach the susceptor without crossing a stream of the coating material from the coating apparatus.

17. A coating system comprising:
a work piece;
a work piece support for holding the work piece, wherein the work piece support is configured to rotate the work piece;
a plasma gun for plasma-based deposition of the coating material on the work piece;
a susceptor positioned adjacent to and downstream from the work piece, wherein the susceptor has a central opening configured to allow excess coating material to pass through the susceptor, and wherein the work piece support is positioned between the plasma gun and the susceptor; and
a first electron gun configured to direct a first electron beam at the susceptor such that the susceptor radiates heat toward the work piece, wherein the first electron gun is positioned such that the first electron beam can reach the susceptor without crossing a stream of the coating material from the plasma gun.

18. The coating system of claim 17 and further comprising:
a thermal hood located at least partially inside the process chamber, wherein the thermal hood partially surrounds the work piece support to provide reflective, infrared thermal shielding, and wherein the thermal hood includes an opening for accepting a stream of the coating material from the coating apparatus.

19. The coating system of claim 17, wherein the susceptor has a shape selected from the group consisting of: an annular shape and a frusto-conical shape.

20. The coating system of claim 17 and further comprising:
a process chamber, wherein the plasma gun, the work piece support and the susceptor are each positioned at least partially within the process chamber, and wherein an interior of the process chamber is in a vacuum.

* * * * *